United States Patent
Kobayashi et al.

(10) Patent No.: US 10,750,609 B2
(45) Date of Patent: Aug. 18, 2020

(54) STRUCTURE AND METHOD FOR MOUNTING SHIELDED MODULE ON PRINTED WIRING BOARD, AND SHIELDED MODULE

(71) Applicant: Murata Manufacturing Co., Ltd., Nagaokakyo-shi, Kyoto-fu (JP)

(72) Inventors: Norifumi Kobayashi, Nagaokakyo (JP); Tomoyoshi Hiei, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/553,389

(22) Filed: Aug. 28, 2019

(65) Prior Publication Data

US 2019/0387612 A1    Dec. 19, 2019

Related U.S. Application Data

(63) Continuation of application No. PCT/JP2018/007828, filed on Mar. 1, 2018.

(30) Foreign Application Priority Data

Mar. 6, 2017   (JP) ................ 2017-042105
Oct. 30, 2017   (JP) ................ 2017-209013

(51) Int. Cl.
 *H01L 23/552*   (2006.01)
 *H05K 9/00*    (2006.01)
 (Continued)

(52) U.S. Cl.
 CPC ......... *H05K 1/0218* (2013.01); *H01L 23/552* (2013.01); *H05K 1/0215* (2013.01); *H05K 3/303* (2013.01); *H05K 9/0028* (2013.01)

(58) Field of Classification Search
 CPC ................ H05K 9/0028; H01L 23/552
 See application file for complete search history.

(56) References Cited

U.S. PATENT DOCUMENTS

| | | | |
|---|---|---|---|
| 6,472,724 B1 | 10/2002 | Matsuzawa et al. | |
| 2012/0286415 A1 | 11/2012 | Sakai et al. | |
| 2017/0324231 A1* | 11/2017 | Mizutani | B60R 16/0215 |

FOREIGN PATENT DOCUMENTS

| | | |
|---|---|---|
| JP | 09-215324 A | 8/1997 |
| JP | 2000-307289 A | 11/2000 |

(Continued)

OTHER PUBLICATIONS

Official Communication issued in International Patent Application No. PCT/JP2018/007828, dated Apr. 24, 2018.

*Primary Examiner* — Hung V Ngo
(74) *Attorney, Agent, or Firm* — Keating & Bennett, LLP

(57) ABSTRACT

In a structure for mounting a shielded module on a printed wiring board, the shielded module includes a mounting substrate, a shielding layer, and a solder layer. Electronic components are mounted on a main surface of the mounting substrate. The shielding layer is provided in an area from above the mounting substrate to a side surface of the mounting substrate and covers the electronic components. The solder layer is provided on a side surface of the shielding layer. The shielding layer is connected to a surface electrode located on the printed wiring board via the solder layer. The surface of the solder layer is depressed.

10 Claims, 4 Drawing Sheets

(51) Int. Cl.
*H05K 1/02* (2006.01)
*H05K 3/30* (2006.01)

(56) References Cited

FOREIGN PATENT DOCUMENTS

| | | |
|---|---|---|
| JP | 2005-093752 A | 4/2005 |
| JP | 2009-239100 A | 10/2009 |
| JP | 2011-035058 A | 2/2011 |
| JP | 2011-160115 A | 8/2011 |
| JP | 2012-221992 A | 11/2012 |
| JP | 2012-256842 A | 12/2012 |

* cited by examiner

FIG. 10A
FIG. 10B
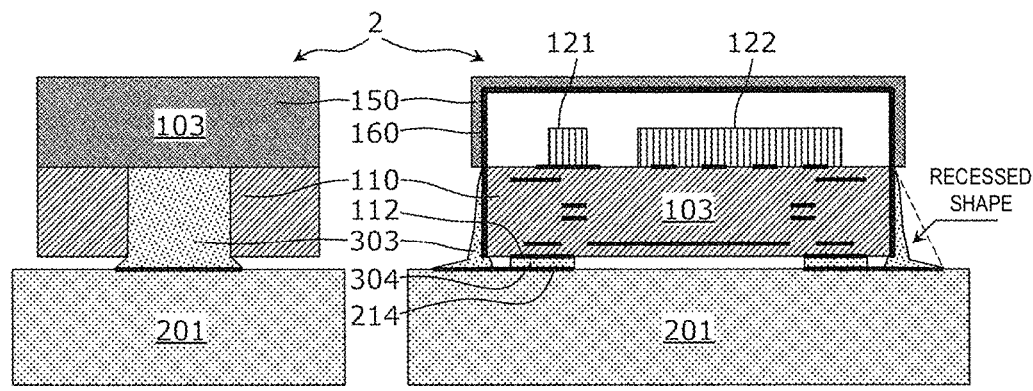
FIG. 11
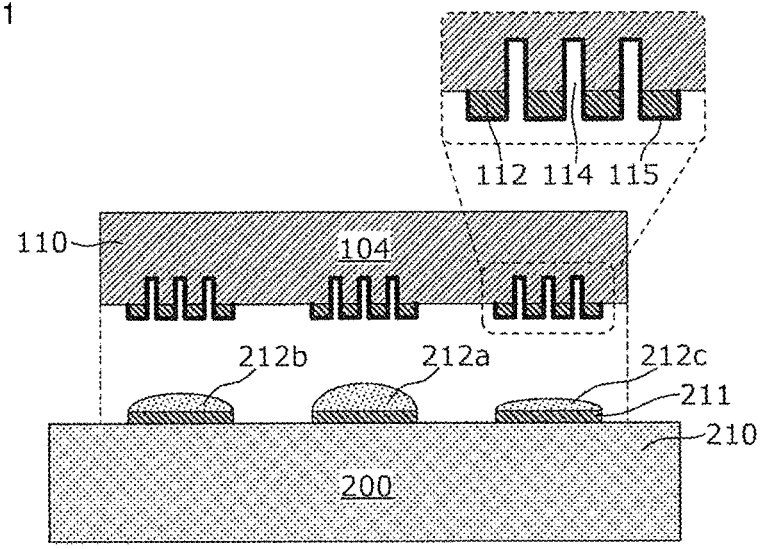
FIG. 12
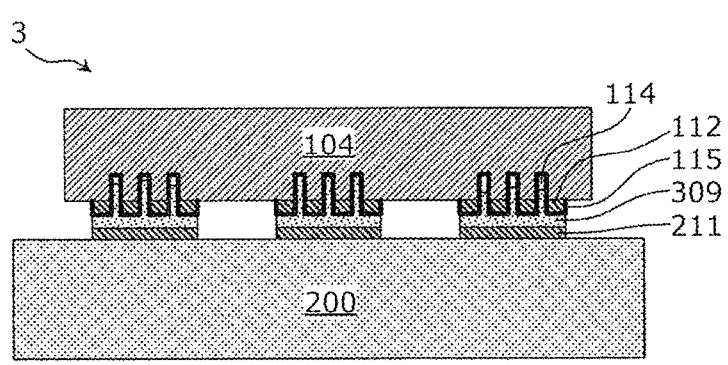

STRUCTURE AND METHOD FOR MOUNTING SHIELDED MODULE ON PRINTED WIRING BOARD, AND SHIELDED MODULE

CROSS REFERENCE TO RELATED APPLICATIONS

This application claims the benefit of priority to Japanese Patent Application No. 2017-042105 filed on Mar. 6, 2017 and Japanese Patent Application No. 2017-209013 filed on Oct. 30, 2017, and is a Continuation Application of PCT Application No. PCT/JP2018/007828 filed on Mar. 1, 2018. The entire contents of each application are hereby incorporated herein by reference.

BACKGROUND OF THE INVENTION

1. Field of the Invention

The present invention relates to a structure and a method for mounting a shielded module on a printed wiring board, and also to a shielded module.

2. Description of the Related Art

Hitherto, a DC-DC converter is known as an example of a shielded module (see Japanese Unexamined Patent Application Publication No. 09-215324, for example).

The DC-DC converter disclosed in Japanese Unexamined Patent Application Publication No. 09-215324 includes a multilayer body. Electronic components, coils, transistors, diodes, and the like, are connected onto a circuit pattern by soldering, for example, so as to be disposed on the multilayer body. The multilayer body, electronic components, and circuit pattern are covered with a metal casing made of copper. A common ground electrode layer is disposed in the multilayer body. The common ground electrode layer extends to the side surfaces of the multilayer body and is electrically connected to the inner side of the metal casing. With this configuration, the metal casing is grounded via its inner side connected to the common ground electrode layer.

As the size of modules is becoming smaller, the following problem may arise in the DC-DC converter as a known shielded module.

The extending portion of the common ground electrode layer is miniaturized and is thus more likely to be broken. Additionally, the area of the common ground electrode layer exposed on the side surfaces of the multilayer body is becoming small, thus making it difficult to reliably connect the common ground electrode layer to the metal casing. It is thus desirable to provide a structure in which a metal casing is able to be grounded more reliably.

Regardless of whether a metal casing is provided in a module, due to variations in the amount of solder paste applied to a printed wiring board, for example, a module is sometimes fixed to the printed wiring board in a slanting manner (this state may also be referred to that components are mounted irregularly). This state impairs the reliability of the mounting of a module and is desirably eliminated in a module provided with a metal casing as well as in a module without.

SUMMARY OF THE INVENTION

Preferred embodiments of the present invention provide structures and methods for highly reliably mounting a shielded module on a printed wiring board, and shielded modules.

In a structure for mounting a shielded module on a printed wiring board according to a preferred embodiment of the present invention, the shielded module includes a mounting substrate, a shielding layer, and a solder layer. At least one electronic component is mounted on one main surface of the mounting substrate. The shielding layer is provided in an area from above the mounting substrate to a side surface of the mounting substrate and covers the at least one electronic component. The solder layer is provided on a side surface of the shielding layer. The shielding layer is connected to a surface electrode located on the printed wiring board via the solder layer, and a surface of the solder layer is depressed.

"The surface of the solder layer is depressed" means that the exposed surface of the solder layer has a recessed shape. More specifically, the central portion of the exposed surface of the solder layer may be withdrawn inward from a line segment connecting two points, that is, a point at the top peripheral edge of the exposed surface of the solder layer and a point at the printed wiring board.

With this configuration, due to the volume of the depressed portion, the amount of solder is able to be reduced to be smaller than that in a mounting structure including a solder layer which does not include a depressed portion. That is, with a smaller amount of solder, the bonding strength at a bonding portion between the module and the printed wiring board is substantially equivalent to that in a mounting structure including a solder layer which does not include a depressed portion. In other words, with the same amount or substantially the same amount of solder, the bonding strength is improved. It is thus possible to provide a mounting structure in which a module and a printed wiring board are highly reliably bonded to each other.

The mounting substrate may include a ground electrode and a ground terminal. The ground terminal is located on the other main surface of the mounting substrate and is electrically connected to the ground electrode. The ground terminal may be connected to the surface electrode.

With this configuration, both of the ground terminal and the shielding layer are connected to the surface electrode, thus providing more connecting portions between the shielded module and the printed wiring board. It is also possible to reliably and easily connect the shielding layer and the ground electrode of the mounting substrate with each other via the surface electrode. As a result, the reliability of the mounting of the module is further improved.

The solder layer may also be provided on a top surface of the shielding layer.

With this configuration, the solder layer provided on the top surface of the shielding layer is able to define and function as a shielding layer, thus improving the shielding capability in the mounting structure.

A solder rejecting layer may be provided on a front portion of a top surface of the shielding layer. The solder rejecting layer has a smaller wettability for a solder than the shielding layer has for the solder. The solder rejecting layer may extend to a portion of the side surface of the shielding layer.

This configuration makes it less likely for the solder layer to climb up, and the shielding layer and the surface electrode of the printed wiring board are able to be reliably connected to each other by the solder layer. As a result, the reliability of the mounting of the module is able to be further improved.

The entirety of the side surface of the shielding layer may be connected to the surface electrode via the solder layer.

With this configuration, the shielded module is able to be fixed to the printed wiring board more firmly. Additionally, a gap between the entirety of the side surface of the shielding layer and the printed wiring board is sealed with the solder layer, thus achieving a high shielding effect and liquid tightness. As a result, the reliability of the mounting of the module is able to be further improved.

The surface electrode may be set at a ground potential.

With this configuration, both of the ground terminal and the shielding layer are able to be connected to the surface electrode which is set at a ground potential, thus making it possible to provide grounding more reliably.

The mounting substrate may include a terminal electrode and a plurality of hollows. The terminal electrode is located on the other main surface of the mounting substrate. The plurality of hollows are provided in a depth from a surface of the terminal electrode to a portion of the mounting substrate. The plurality of hollows may be at least partially filled with a solder which connects the terminal electrode and the surface electrode.

With this configuration, even if the amount of solder paste varies, an excess portion is pressed into at least a portion of the hollows. As a result, the amount of solder between the terminal electrode and the surface electrode is substantially uniform. It is thus less likely that the module is displaced from the printed wiring board or components are irregularly mounted. Additionally, the solder is pressed into the hollows to provide an anchor effect, thus improving the bonding strength of the terminal electrode to the mounting substrate.

A method for mounting a shielded module on a printed wiring board according to a preferred embodiment of the present invention includes placing a shielded module on a printed wiring board, the shielded module including a mounting substrate, a shielding layer, and a pre-applied solder, at least one electronic component being mounted on one main surface of the mounting substrate, the shielding layer being provided in an area from above the mounting substrate to a side surface of the mounting substrate and covering the at least one electronic component, the pre-applied solder being provided on a side surface of the shielding layer; and connecting, by melting and solidifying the pre-applied solder, the shielding layer to a surface electrode located on the printed wiring board via the melted and solidified pre-applied solder.

In the above-described method, a solder is pre-applied to the side surface of the shielding layer of the shielded module. Then, the pre-applied solder is melted and flowed in a reflow process, thus bonding the shielding layer and the surface electrode of the printed wiring board. Therefore, the shielding layer is able to be grounded reliably via the surface electrode of the printed wiring board unlike a case in which a shielding layer is connected to a ground electrode exposed on the end surfaces of a mounting substrate.

In the reflow process, the shielded module and the printed wiring board attract each other due to surface tension of the melted pre-applied solder. Components are thus less likely to be mounted irregularly even if the amount of solder paste applied to the printed wiring board varies to some extent. Additionally, the pre-applied solder improves the bonding strength between the shielded module and the printed wiring board.

It is thus possible to provide a method for highly reliably mounting a shielded module on a printed wiring board.

The pre-applied solder may also be provided on a top surface of the shielding layer. When the pre-applied solder is melted and solidified, at least a portion of the pre-applied solder provided on the top surface may move to the side surface of the shielding layer.

According to this method, the amount of solder is able to be increased to be greater than that when a solder is provided only on the side surface of the shielding layer, thus further improving the strength between the module and the printed wiring board. If a portion of the solder provided on the top surface of the shielding layer remains even after the reflow process, it may define and function as a shielding layer of the shielded module.

A solder rejecting layer may be provided on a front portion of a top surface of the shielding layer. The solder rejecting layer has a smaller wettability for a solder than the shielding layer has for the solder. The solder rejecting layer may extend to a portion of the side surface of the shielding layer.

According to this method, the pre-applied solder is less likely to climb up. By melting and solidifying the pre-applied solder, the shielding layer and the surface electrode of the printed wiring board are able to be reliably connected with each other. As a result, the reliability of the mounting of the module is able to further be improved.

The pre-applied solder may be provided on the entirety of the side surface of the shielding layer. The entirety of the side surface of the shielding layer may be connected to the surface electrode.

According to this method, the shielded module is able to be firmly fixed to the printed wiring board. Additionally, a gap between the entirety of the side surface of the shielding layer and the printed wiring board is sealed with the pre-applied solder, thus achieving a high shielding effect and liquid tightness. As a result, the reliability of the mounting of the module is able to be further improved.

The mounting substrate may include a terminal electrode on the other main surface of the mounting substrate. A solder paste may be applied between the terminal electrode and the surface electrode located on the printed wiring board. While the pre-applied solder in a melting state is contacting the shielding layer and the surface electrode, by melting and solidifying the solder paste, the terminal electrode may be connected to the surface electrode via the melted and solidified solder paste.

According to this method, in the reflow process, the pre-applied solder first melts and flows to reach the printed wiring board. Then, the solder paste starts to melt while the pre-applied solder is melting. In a subsequent cooling process, the melted solder paste first solidifies so that the terminal electrode and the surface electrode are bonded to each other. Then, the melted pre-applied solder solidifies so that the shielding layer and the surface electrode are bonded to each other.

That is, while the shielded module and the printed wiring board are attracted to each other due to surface tension of the pre-applied solder, the terminal electrode and the surface electrode are bonded to each other by the solder paste being melted and solidified. Components are thus less likely to be mounted irregularly even if the amount of solder paste applied to the printed wiring board varies to some extent.

As a result, the reliability of the mounting of the module is further improved.

The mounting substrate may further include a plurality of hollows that are formed in a depth from a surface of the terminal electrode to a portion of the mounting substrate. The hollows may be at least partially filled with the solder paste.

According to this method, even with some variations in the amount of solder paste, an excess portion fills at least a portion of the hollows. Thus, the amount of solder between the terminal electrode and the surface electrode becomes substantially uniform. It is thus less likely that the module is displaced from the printed wiring board or components are mounted irregularly. Additionally, the solder is pressed into the hollows to provide an anchor effect, thus improving the bonding strength of the terminal electrode to the mounting substrate. It is thus possible to provide a shielded module that is able to be mounted highly reliably.

With the mounting structures according to preferred embodiments of the present invention, a shielded module and a printed wiring board are able to be reliably bonded to each other with a smaller amount of solder than in a mounting structure of the related art.

By applying the mounting methods according to preferred embodiments of the present invention, it is possible to mount a shielded module on a printed wiring board in such a manner that components are less likely to be mounted irregularly or unevenly.

The shielded modules according to the preferred embodiment of the present invention are able to be mounted in a simpler manner than in the related art.

According to the preferred embodiments of the present invention, structures and methods for highly reliably mounting a shielded module on a printed wiring board are able to be provided, and also shielded modules are able to be provided.

The surface electrode may be set at a ground potential.

According to this method, both of the ground terminal and the shielding layer are able to be connected to the surface electrode which is set at a ground potential, thereby making it possible to provide grounding more reliably.

A shielded module according to a preferred embodiment of the present invention includes a mounting substrate, a shielding layer, and a pre-applied solder. At least one electronic component is mounted on one main surface of the mounting substrate. The shielding layer is provided in an area from above the mounting substrate to a side surface of the mounting substrate and covers the at least one electronic component. The pre-applied solder is provided on a side surface of the shielding layer.

This configuration eliminates the need to apply a solder to the printed wiring board in accordance with the size of the module when bonding the module to the printed wiring board. A shielded module that is able to be mounted in a simple manner is thus able to be provided.

The mounting substrate may include a ground electrode and a ground terminal. The ground terminal is located on the other main surface of the mounting substrate and is electrically connected to the ground electrode.

With this configuration, both of the ground terminal and the shielding layer are connected to the surface electrode, thus providing more connecting portions between the shielded module and the printed wiring board. It is also possible to reliably and easily connect the shielding layer and the ground electrode of the mounting substrate with each other via the surface electrode. A shielded module that is able to be mounted highly reliably is thus able to be provided.

The pre-applied solder may also be provided on a top surface of the shielding layer.

With this configuration, the solder layer provided on the top surface of the shielding layer is also able to define and function as a shielding layer. A shielded module with an improved shielding capability is able to thus be provided.

A solder rejecting layer may be provided on a front portion of a top surface of the shielding layer. The solder rejecting layer has a smaller wettability for a solder than the shielding layer has for the solder. The solder rejecting layer may extend to a portion of the side surface of the shielding layer.

This configuration makes it less likely for the solder layer to climb up, and the shielding layer and the surface electrode of the printed wiring board are able to be reliably connected to each other by the solder layer. It is thus possible to provide a shielded module that is able to be mounted highly reliably.

The mounting substrate may include a terminal electrode and a plurality of hollows. The terminal electrode is located on the other main surface of the mounting substrate. The plurality of hollows are provided in a depth from a surface of the terminal electrode to a portion of the mounting substrate.

With this configuration, even if the amount of solder paste varies, an excess portion is pressed into at least a portion of the hollows. Thus, the amount of solder between the terminal electrode and the surface electrode becomes substantially uniform. It is thus less likely that the module is displaced from the printed wiring board or components are irregularly mounted. Additionally, the solder is pressed into the hollows to provide an anchor effect, thus improving the The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 10A and 10B show views illustrating an example of a structure for mounting the module on the printed wiring board according to the third modified example.

FIG. 11 is a sectional view for explaining an example of a method for mounting a module on a printed wiring board according to a third preferred embodiment of the present invention.

FIG. 12 is a sectional view illustrating an example of a structure for mounting the module on the printed wiring board according to the third preferred embodiment of the present invention.

DETAILED DESCRIPTION OF THE PREFERRED EMBODIMENTS

Figure 1:
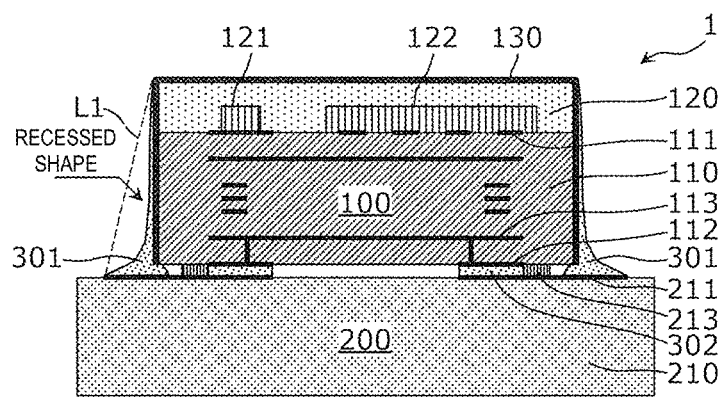
FIG. 1 is a sectional view illustrating an example of a structure for mounting a module on a printed wiring board according to a first preferred embodiment of the present invention.

Preferred embodiments of the present invention will be described in detail below with reference to the drawings. All of the preferred embodiments described below illustrate general or specific examples. Numeric values, configurations, materials, elements, positions and connection states of the elements, manufacturing steps, and the order of manufacturing steps illustrated in the following preferred embodiments are only examples and are not described to limit the present invention. Among the elements illustrated in the following preferred embodiments, the elements that are not recited in the independent claims will be described as optional elements. The sizes and dimensional ratios of the elements in the drawings are not necessarily illustrated as actual sizes and ratios.

First Preferred Embodiment

In a first preferred embodiment of the present invention, a structure for mounting a shielded module on a printed wiring board will be described below. In the following description, a shielded module will simply be called a module for the sake of simplicity. That is, the term "module" in the following description means a shielded module.

FIG. 1 is a sectional view illustrating an example of a structure for mounting a module on a printed wiring board according to the first preferred embodiment. FIG. 1 illustrates a mounting structure 1 in which a module 100 is mounted on a printed wiring board 200. For the sake of simple representation, identical or similar elements are represented by the same pattern and not all of them are designated by reference numerals.

In the module 100, on one main surface (top main surface in the example of FIG. 1) of a mounting substrate 110, surface electrodes 111 are provided, and electronic components 121 and 122 are mounted on this main surface of the mounting substrate 110 with the surface electrodes 111 located therebetween. The electronic components 121 and 122 are sealed with a resin layer 120. On the other main surface (bottom main surface in the example of FIG. 1) of the mounting substrate 110, plural terminal electrodes 112 are provided, and wiring conductors including a ground electrode 113 are provided on inner layers of the mounting substrate 110. At least one terminal electrode 112 is electrically connected to the ground electrode 113. The terminal electrode 112 connected to the ground electrode 113 is an example of a ground terminal electrically connected to the ground electrode 113.

In one example, the mounting substrate 110 may preferably be a multilayer substrate including a plurality of ceramic base layers stacked on each other.

A shielding layer 130 is provided on the surface of the resin layer 120 and side surfaces of the mounting substrate 110. That is, the shielding layer 130 is provided in an area from above the mounting substrate 110 to the side surfaces thereof and covers the electronic components 121 and 122.

In one example, the shielding layer 130 is preferably a coating film including a metal material containing at least one of copper, nickel, silver, and gold, and may be provided on the surfaces of the resin layer 120 and the mounting substrate 110 by sputtering.

The module 100 may preferably be a DC-DC converter module by way of example. The electronic components 121 and 122 may preferably be a capacitor and a switching IC, for example. Some of the wiring conductors provided on the inner layers of the mounting substrate 110 may define a built-in coil. The shielding layer 130 provided in an area from above the mounting substrate 110 to the side surfaces thereof is able to reduce noise radiation from the built-in coil as well as noise from the capacitor and the switching IC.

The printed wiring board 200 includes a surface electrode 211, which is set at a ground potential, on the main surface of a wiring substrate 210.

An application circuit that uses the module 100 is provided on the wiring substrate 210.

In one example, the wiring substrate 210 may preferably be a single layer substrate or a multilayer substrate including a resin material containing phenol or epoxy.

The surface electrode 211 is provided at first and second portions of the main surface of the wiring substrate 210. The surface electrode 211 opposes a terminal electrode 112 at the first portion and opposes an end surface of the shielding layer 130 at the second portion. A resist 213 is disposed at a boundary between the first and second portions of the wiring substrate 210.

Because of a provision of a solder layer 301, side surfaces of the shielding layer 130 and the surface electrode 211 are bonded to each other. Because of the provision of a solder layer 302, the terminal electrodes 112 and the surface electrode 211 are bonded to each other.

The surface of the solder layer 301 is depressed. This means that the exposed surface of the solder layer 301 has a recessed shape. More specifically, the central portion of the exposed surface of the solder layer 301 may be withdrawn inward from a line segment connecting two points, that is, a point at the top peripheral edge of the exposed surface of the solder layer 301 and a point at the printed wiring board (indicated by a thin broken line L1 in FIG. 1).

Advantages of the module 100 and the mounting structure 1 will be described below by comparing them with a module 900 and a mounting structure 9 according to a comparative example.

Figure 2:
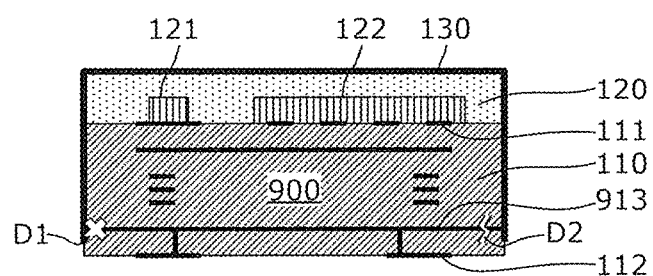
FIG. 2 is a sectional view illustrating an example of the structure of a module according to a comparative example.

FIG. 2 is a sectional view illustrating an example of the structure of the module 900 according to the comparative example. The module 900 is different from the module 100 shown in FIG. 1 in that a ground electrode 913 extends to the end surfaces of the mounting substrate 110.

In the module 900, the shielding layer 130 is grounded due to being connected to the ground electrode 913 exposed on the end surfaces of the mounting substrate 110. This increases the possibility that failures, such as a poor connection D1 and a break D2, will occur as the size of the module is reduced.

Figure 3:
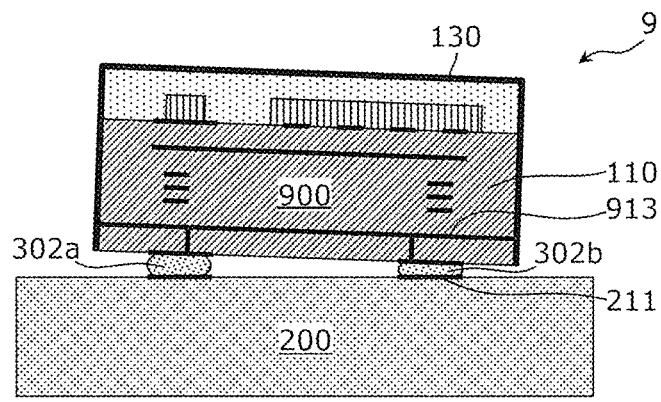
FIG. 3 is a sectional view illustrating an example of a structure for mounting a module on a printed wiring board according to a comparative example.

FIG. 3 is a sectional view illustrating an example of the mounting structure 9 according to the comparative example. The mounting structure 9 is a structure in which the module 900 shown in FIG. 2 is mounted on the printed wiring board 200. In the mounting structure 9, due to variations in the amount of applied solder paste included in solder layers 302a and 302b, for example, components may be mounted irregularly. Additionally, the shielding layer 130 is grounded merely via the ground electrode 913 provided within the mounting substrate 110 and exposed on the end surfaces of the mounting substrate. Accordingly, if a poor connection D1 or a break D2 shown in FIG. 2 occurs, the shielding function of the shielding layer 130 is lost.

In contrast to the comparative example having the above-described disadvantages, the mounting structure 1 shown in FIG. 1 provides the following advantages.

In the mounting structure 1, the side surfaces of the shielding layer 130 and the surface electrode 211 of the printed wiring board 200 are bonded to each other by the solder layer 301. Both of the terminal electrodes 112 (including the ground terminal) and the shielding layer 130 are connected to the surface electrode 211, thus providing more connecting portions between the module 100 and the printed wiring board 200.

The shielding layer 130 and the ground electrode 113 of the mounting substrate 110 are able to be connected with each other via the surface electrode 211 more reliably and more easily than in the mounting structure 9 in which the shielding layer 130 is grounded merely via the ground electrode 913 provided within the mounting substrate 110. That is, the shielding layer 130 is able to be grounded more reliably via the solder layer 301 and the surface electrode 211.

The resist 213 is able to prevent short-circuiting between the shielding layer 130 and the signal terminal electrode which is not connected to the ground electrode 113.

It is thus possible to provide a structure for highly reliable mounting of a shielded module on a printed wiring board.

In FIG. 1, both of the terminal electrodes 112 and the shielding layer 130 are connected to the same surface electrode 211. However, this configuration is only an example. The terminal electrodes 112 and the shielding layer 130 may be connected to different surface electrodes, which are set at a ground potential.

In the mounting structure 1, the entirety of the side surfaces of the shielding layer 130 may be connected to the surface electrode 211 via the solder layer 301. This is able to firmly fix the module 100 to the printed wiring board 200. Additionally, gaps between the entirety of the side surfaces of the shielding layer 130 and the printed wiring board 200 are sealed with the solder layer 301, thus achieving a high shielding effect and liquid tightness. As a result, the reliability of the mounting of the module is able to be further improved.

By configuring the surface of the solder layer 301 in a recessed shape in the mounting structure 1, the following advantages are able to be provided.

Figure 4:
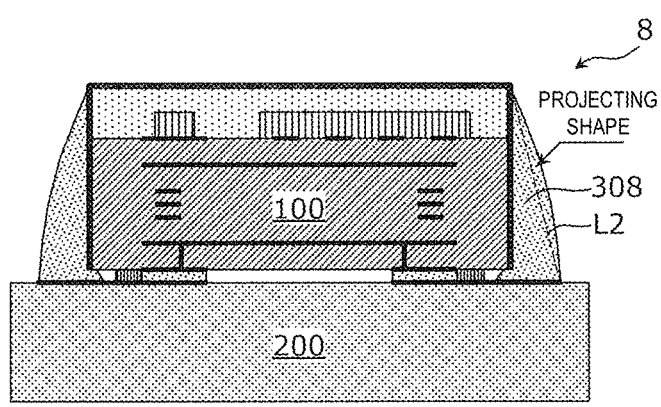
FIG. 4 is a sectional view illustrating an example of a structure for mounting a module on a printed wiring board according to a comparative example.

FIG. 4 is a sectional view illustrating an example of a mounting structure 8 according to a comparative example. The mounting structure 8 is different from the mounting structure 1 in that the exposed surface of a solder layer 308 has a projecting shape. More specifically, the central portion of the exposed surface of the solder layer 308 extends outward from a line segment connecting two points, that is, a point at the top peripheral edge of the exposed surface of the solder layer 308 and a point at the printed wiring board (indicated by a thin broken line L2 in FIG. 4). The solder layer 308 has such a shape because of an excessive amount of solder or a poor wettability of the solder layer 308 for the shielding layer.

In the mounting structure 1, due to the volume of a depressed portion of the solder layer 301, the amount of solder is able to be reduced to be smaller than that in the mounting structure 8 including the solder layer 308 that does not include a depressed portion. That is, with a smaller amount of solder than that in the mounting structure 8, the bonding area (that is, the bonding strength) between the module and the printed wiring board in the mounting structure 1 is substantially equivalent to that in the mounting structure 8. In other words, with the inclusion of the same amount or substantially the same amount of solder, the bonding strength of the mounting structure 1 is higher than that of the mounting structure 8 including the solder layer 308 which does not include a depressed portion.

The module to be used in the mounting structure providing the above-described advantages is not limited to the module 100. For example, the following modified examples may be provided.

Figure 5:
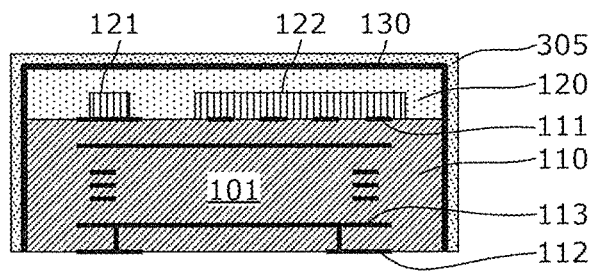
FIG. 5 is a sectional view illustrating an example of the structure of a module according to a first modified example of a preferred embodiment of the present invention.

FIG. 5 is a sectional view illustrating an example of the structure of a module according to a first modified example of a preferred embodiment of the present invention.

A module 101 shown in FIG. 5 is different from the module 100 in that a solder layer 305 is also provided on the top surface of the shielding layer 130.

A mounting structure with the module 101 provides advantages similar to those of the mounting structure 1, and also, the solder layer 305 provided on the top surface of the shielding layer 130 is able to also define and function as a shielding layer. It is thus possible to provide a structure for mounting a shielded module with an improved shielding capability on a printed wiring board.

Figure 6:
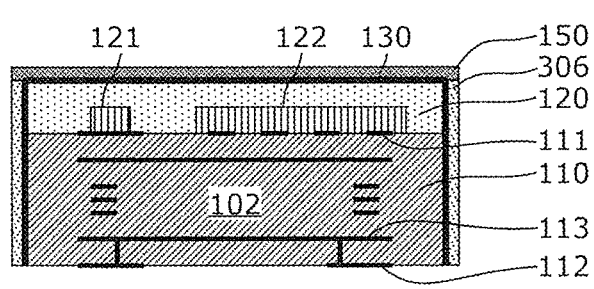
FIG. 6 is a sectional view illustrating an example of the structure of a module according to a second modified example of a preferred embodiment of the present invention.

FIG. 6 is a sectional view illustrating an example of the structure of a module according to a second modified example of a preferred embodiment of the present invention.

A module 102 shown in FIG. 6 is different from the module 100 in that a solder rejecting layer 150 is provided on the front portion of the top surface of the shielding layer 130. The solder rejecting layer 150 has a smaller wettability for solder than the shielding layer 130 has for the solder, and preferably includes a resin layer, fluorine coating, or oxide film, for example.

A mounting structure with the module 102 provides advantages similar to those of the mounting structure 1, and also, the solder rejecting layer 150 makes it less likely for the solder layer 306 to climb up, thus further improving the reliability of the mounting of the module.

Second Preferred Embodiment

In a second preferred embodiment of the present invention, a method for mounting a module on a printed wiring board will be discussed. In this method, a solder is pre-applied to side surfaces of a shielding layer of a module. Then, the pre-applied solder is melted and flowed in a reflow process, thus bonding the shielding layer and a surface electrode of the printed wiring board.

Figure 7:
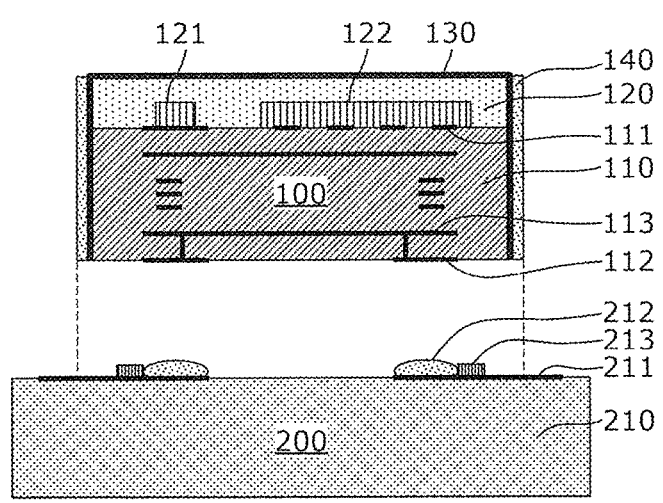
FIG. 7 is a sectional view for explaining an example of a method for mounting a module on a printed wiring board according to a second preferred embodiment of the present invention.

FIG. 7 is a sectional view for explaining a non-limiting example of a method for mounting a module on a printed wiring board according to the second preferred embodiment. FIG. 7 illustrates a module 100 and a printed wiring board 200 before mounting.

Figure 8:
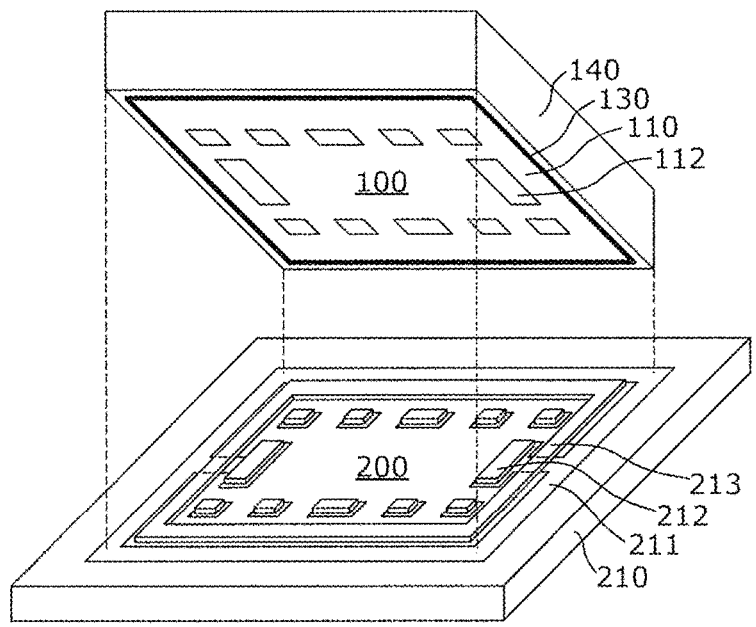
FIG. 8 is a perspective view illustrating an example of the external appearance of the module and the printed wiring board according to the second preferred embodiment of the present invention.

FIG. 8 is a perspective view illustrating an example of the external appearance of the module 100 and the printed wiring board 200.

As shown in FIGS. 7 and 8, a pre-applied solder 140 is provided at side surfaces of the shielding layer 130.

In one example, the pre-applied solder 140 is preferably a solder paste containing at least one of tin and silver, and may be provided on the surfaces of the shielding layer 130 by printing or dipping.

A solder paste 212 and a resist 213 are provided on predetermined portions of the surface electrode 211 of the wiring substrate 210.

After performing positioning of the module 100 and the printed wiring board 200, they are subjected to a reflow process, thus providing the mounting structure 1 shown in FIG. 1. In FIG. 1, the solder layer 301 is a layer formed by the pre-applied solder 140 being melted, flowed, and reaching the surface electrode 211 of the printed wiring board 200 and being solidified. The solder layer 302 is a layer formed by the solder paste 212 being melted and flowed between the terminal electrodes 112 and the surface electrode 211 of the printed wiring board 200 and being solidified.

In the above-described mounting method, the following advantages are obtained by providing the pre-applied solder 140 on the side surfaces of the shielding layer 130 of the module 100.

Because of the provision of the solder layer 301, which is formed by the pre-applied solder 140 being melted and flowed in a reflow process and then being solidified, the shielding layer 130 and the surface electrode 211 of the printed wiring board 200 are bonded to each other. Because of the provision of the solder layer 302, which is formed by the solder paste 212 being melted and flowed in a reflow process and then being solidified, the terminal electrodes 112 and the surface electrode 211 of the printed wiring board 200 are bonded to each other. In this manner, both of the terminal electrodes 112 (including the ground terminal) and the shielding layer 130 are connected to the surface electrode 211, thus providing more connecting portions between the module 100 and the printed wiring board 200.

The shielding layer 130 and the ground electrode 113 of the mounting substrate 110 are able to be connected with each other more reliably and more easily via the surface electrode 211 than in the mounting structure 9 (see FIG. 3) in which the shielding layer 130 is grounded merely via the ground electrode 913 provided within the mounting substrate 110. That is, the shielding layer 130 is able to be grounded reliably via the surface electrode 211 of the printed wiring board 200.

The resist 213 is able to prevent short-circuiting between the shielding layer 130 and the signal terminal electrode which is not connected to the ground electrode 113.

The solder 140 is applied to the shielding layer 130 in advance. This eliminates the need to apply a solder to the printed wiring board 200 in accordance with the size of the module 100 when bonding the module 100 to the printed wiring board 200. The mounting method is thus simplified.

In the reflow process, the module 100 and the printed wiring board 200 attract each other due to surface tension of the melted pre-applied solder 140. It is thus less likely that components are mounted irregularly even if the amount of solder paste 212 applied to the printed wiring board 200 slightly varies. Additionally, the solder layer 301 increases the bonding strength between the module 100 and the printed wiring board 200.

To more effectively prevent components from being mounted irregularly, the melting point of the pre-applied solder 140 may be lower than that of the solder paste 212. Then, in the reflow process, the pre-applied solder 140 first melts and flows to reach the printed wiring board 200, and the module 100 and the printed wiring board 200 attract each other due to surface tension of the pre-applied solder 140. Then, the solder paste 212 starts to melt while the pre-applied solder 140 is melting.

In a subsequent cooling process, the solder paste 212 first solidifies so that the terminal electrodes 112 and the surface electrode 211 are bonded to each other. Then, the pre-applied solder 140 solidifies so that the shielding layer 130 and the surface electrode 211 are bonded to each other.

That is, while the module 100 and the printed wiring board 200 are attracted to each other due to surface tension of the melted pre-applied solder 140, the terminal electrodes 112 and the surface electrode 211 are bonded to each other by the solder paste 212 being melted and solidified. It is thus less likely that components are mounted irregularly even if the amount of applied solder paste 212, which forms the solder layer 302, on the printed wiring board 200 varies to some extent. As a result, the mounting structure 1 for highly reliably mounting the module 100 is able to be provided.

The above-described mounting method may be applied, not only to the mounting structure 1, but also to other mounting structures.

For example, the module 101 shown in FIG. 5 may be mounted on the printed wiring board 200 according to the above-described mounting method. In the module 101, a solder, which defines and functions as the solder layer 305, is applied also to the top surface of the shielding layer 130 in advance. This pre-applied solder on the top surface of the shielding layer 130 melts and flows in a reflow process and moves to the side surfaces of the shielding layer 130.

The amount of solder of the solder layer 305 formed by the pre-applied solder being solidified is able to be increased to be greater than that when a solder is provided only on the side surfaces of the shielding layer 130, thereby further improving the connecting strength between the module 101 and the printed wiring board 200. That is, the pre-applied solder provided on the top surface of the shielding layer 130 also contributes to connecting the module 101 and the printed wiring board 200, thus further improving the connecting strength therebetween and accordingly making the mounting structure more stable.

If a portion of the pre-applied solder provided on the top surface of the shielding layer 130 remains even after the reflow process, it may define and function as a shielding layer of the module 101.

The module 102 shown in FIG. 6 may be mounted on the printed wiring board 200 according to the above-described mounting method. In the module 102, a solder, which defines and functions as the solder layer 306, is applied to the side surfaces of the shielding layer 130 in advance, and the solder rejecting layer 150 is provided on the front portion of the top surface of the shielding layer 130.

The solder rejecting layer 150 makes it less likely for the pre-applied solder to climb up. By the pre-applied solder being melted, flowed, and solidified, the shielding layer 130 and a surface electrode (not shown) of the printed wiring board are able to be reliably connected with each other. It is thus possible to provide a structure for highly reliably mounting a shielded module on a printed wiring board.

The above-described mounting method may also be applied to the following mounting structure according to a modified example.

Figures 9A, 9B:
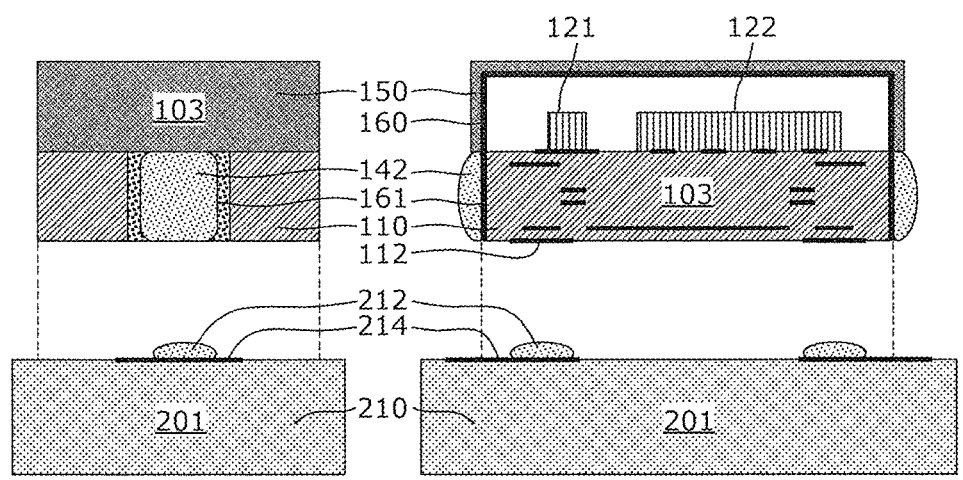
FIGS. 9A and 9B show views for explaining an example of a method for mounting a module on a printed wiring board according to a third modified example of a preferred embodiment of the present invention.

FIGS. 9A and 9B are respectively a side view and a sectional view for explaining an example of a mounting method according to a third modified example of a preferred embodiment of the present invention. FIGS. 9A and 9B respectively illustrate an example of side surfaces and an example of sectional surfaces of a module 103 and a printed wiring board 201 before they are bonded to each other.

FIGS. 10A and 10B are respectively a side view and a sectional view illustrating an example of a structure for mounting the module on the printed wiring board according to the third modified example. FIGS. 10A and 10B respectively illustrate an example of a side surface and an example of a sectional surface of a mounting structure 2 in which the module 103 is mounted on the printed wiring board 201.

The module 103 shown in FIGS. 9A and 9B are different from the module 100 in that a shielding layer includes a metal casing 160 with leg portions.

The metal casing 160 defines a space above the mounting substrate 110 to store the electronic components 121 and 122 therein. Leg portions 161 extend along a portion of the side surfaces of the mounting substrate 110. That is, the metal casing 160 is formed in an area from above the mounting substrate 110 to the side surfaces thereof and covers the electronic components 121 and 122.

The metal casing 160 may include a metal plate containing stainless or copper, for example.

A pre-applied solder 142 is provided on the leg portions 161 of the metal casing 160, and a solder rejecting layer 150 is provided on a portion of the side surfaces of the metal casing 160. The solder rejecting layer 150 may be provided above the leg portions 161 of the metal casing 160, for example.

As in the module 100, terminal electrodes 112 are located on the mounting substrate 110.

A surface electrode 214 is provided on the printed wiring board 201 in a different manner from the surface electrode 211 on the printed wiring board 200. The surface electrode 214 opposes the terminal electrodes 112 of the module 103 and the leg portions 161 of the metal casing 160.

After performing positioning of the module 103 and the printed wiring board 201, they adhere to each other and subjected to a reflow process, thus providing the mounting structure 2 shown in FIGS. 10A and 10B.

In the mounting structure 2, a solder layer 303 is formed by the pre-applied solder 142 being melted, flowed, and reaching the surface electrode 214 of the printed wiring board 201 and being solidified. Because of the provision of the solder layer 303, the leg portions 161 of the metal casing 160 and the surface electrode 214 are bonded to each other. It is seen that the solder layer 303 is formed by the pre-applied solder 142 being melted and solidified since it is formed in a distinctive recessed shape with a depression on its surface.

A solder layer 304 is formed by a solder paste (not shown) provided on the surface electrode 214 being melted and solidified. Because of the provision of the solder layer 304, the terminal electrodes 112 and the surface electrode 214 are bonded to each other.

By including the module 103, which includes a shielding layer defined by the metal casing 160, the mounting structure 2 provides advantages similar to those of the mounting structure 1.

Third Preferred Embodiment

In a third preferred embodiment of the present invention, a structure and method for even more reliably mounting a shielded module on a printed wiring board will be described below.

In a mounting structure according to the third preferred embodiment, a mounting substrate includes a plurality of hollows provided in a depth from the surfaces of terminal electrodes to a portion of the mounting substrate. The mounting structure of the third preferred embodiment may be combined with any one of the mounting structures of the first and second preferred embodiments as a modification to the terminal electrodes and the surrounding portion in the first or second preferred embodiment.

FIG. 11 is a sectional view for explaining an example of a mounting method according to the third preferred embodiment. FIG. 11 illustrates an example of a sectional surface of a module 104 and that of a printed wiring board 200 before they are bonded to each other.

FIG. 12 is a sectional view illustrating an example of a structure for mounting a module on a printed wiring board according to the third preferred embodiment. FIG. 12 illustrates an example of a sectional surface of a mounting structure 3 in which the module 104 is mounted on the printed wiring board 200.

In FIGS. 11 and 12, only elements related to the terminal electrodes 112 and hollows 114, which are a distinctive feature of the module 104, are shown. Elements that are not shown in FIGS. and 12 will be described by referring to the corresponding elements shown in FIG. 7 by way of example.

As shown in FIG. 11, the hollows 114 with bottoms are provided in the module 104. The hollows 114 pass through the terminal electrodes 112 and extend to a portion of the mounting substrate 110, which is an insulating body. A plated film 115 is provided continuously on the surfaces of the terminal electrodes 112 and the inner walls of the hollows 114.

On the side surfaces of the mounting substrate 110, a shielding layer and a pre-applied solder (not shown) similar to the shielding layer 130 and the pre-applied solder 140 shown in FIG. 7, for example, are provided.

In the printed wiring board 200, solder pastes 212a, 212b, and 212c are provided on the surface electrode 211 of the wiring substrate 210.

After performing positioning of the module 104 and the printed wiring board 200, they are subjected to a reflow process. In the reflow process, the solder pastes 212a, 212b, and 212c melt and flow between the terminal electrodes 112 and the surface electrode 211 of the printed wiring board 200. At this time, a pre-applied solder provided on the side surfaces of the shielding layer also melts and flows to reach the printed wiring board 200, though it is not shown. Due to surface tension of the pre-applied solder, the module 104 and the printed wiring board 200 attract each other.

Even if the amounts of solder pastes 212a, 212b, and 212c vary, the solder pastes 212a, 212b, 212c are pressed against the mounting substrate 110 due to surface tension of the melted pre-applied solder. Accordingly, excess portions of the solder pastes 212a, 212b, and 212c are pressed into the hollows 114. To make the solder pastes 212a, 212b, and 212c easily rise up into the hollows 114, the aspect ratio (ratio of the depth to the diameter) of the hollows 114 may preferably be set to be one or greater, for example.

After the reflow process, a solder layer 309 is provided by the solder pastes 212a, 212b, and 212c being solidified. By the provision of the solder layer 309, the terminal electrodes 112 and the surface electrode 211 are bonded to each other.

As a result, the amount of solder between the terminal electrodes 112 and the surface electrode 211 becomes substantially uniform. It is thus less likely that the module is displaced from the printed wiring board or components are irregularly mounted. Additionally, the solder pastes 212a, 212b, and 212c are pressed into the hollows 114 to provide an anchor effect, and the plated film 115 defines and functions as a wedge for bonding the terminal electrodes 112 and the mounting substrate 110, thus improving the bonding strength of the terminal electrodes 112 to the mounting substrate 110. The hollows 114 may entirely be filled with a solder or may partially be filled with a solder while leaving a remaining portion as a space.

By including the mounting structure 3 and the mounting method according to the third preferred embodiment, a structure and method for even more reliably mounting a shielded module on a printed wiring board are able to be provided.

Structures and methods for mounting a shielded module on a printed wiring board and a shielded module according to preferred embodiments of the present invention have been discussed. However, the present invention is not restricted to the above-described preferred embodiments. Modified examples provided by making various modifications to the above-described preferred embodiments by those skilled in the art and other preferred embodiments implemented by combining certain elements in the above-described preferred embodiments without departing from the scope and spirit of the invention may also be encompassed.

Preferred embodiments of the present invention has widespread application in electronic devices, such as mobile information terminals and digital cameras, as structures and methods for mounting a shielded module on a printed wiring board and as a shielded module.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A structure for mounting a shielded module on a printed wiring board, the shielded module comprising:
    a mounting substrate including at least one electronic component mounted on one main surface of the mounting substrate;
    a shielding layer provided in an area from above the mounting substrate to a side surface of the mounting substrate, the shielding layer covering the at least one electronic component; and
    a solder layer provided on a side surface and a top surface of the shielding layer; wherein
    the shielding layer is connected, via the solder layer, to a surface electrode located on the printed wiring board; and
    a surface of the solder layer is depressed.

2. The structure according to claim 1, wherein
    the mounting substrate includes:
        a ground electrode; and
        a ground terminal that is located on another main surface of the mounting substrate and that is electrically connected to the ground electrode; and
    the ground terminal is connected to the surface electrode.

3. The structure according to claim 1, wherein an entirety of the side surface of the shielding layer is connected to the surface electrode via the solder layer.

4. The structure according to claim 1, wherein a potential of the surface electrode is a ground potential.

5. The structure according to claim 1, wherein
    the mounting substrate includes a terminal electrode and a plurality of hollows;
    the terminal electrode is located on another main surface of the mounting substrate;
    the plurality of hollows are provided in a depth from a surface of the terminal electrode to a portion of the mounting substrate; and
    the plurality of hollows are at least partially filled with a solder which connects the terminal electrode and the surface electrode.

6. A shielded module comprising:
    a mounting substrate including at least one electronic component mounted on one main surface of the mounting substrate;
    a shielding layer provided in an area from above the mounting substrate to a side surface of the mounting substrate and covering the at least one electronic component; and
    a pre-applied solder provided on a side surface and a top surface of the shielding layer.

7. The shielded module according to claim 6, wherein the mounting substrate includes:
    a ground electrode; and
    a ground terminal that is located on another main surface of the mounting substrate and that is electrically connected to the ground electrode.

8. The shielded module according to claim 6, wherein the mounting substrate includes a terminal electrode and a plurality of hollows, the terminal electrode being located on another main surface of the mounting substrate, the plurality of hollows being provided in a depth from a surface of the terminal electrode to a portion of the mounting substrate.

9. A shielded module comprising:
    a mounting substrate including at least one electronic component mounted on one main surface of the mounting substrate;
    a shielding layer provided in an area from above the mounting substrate to a side surface of the mounting substrate and covering the at least one electronic component; and
    a pre-applied solder provided on a side surface of the shielding layer; wherein
    a solder rejecting layer is provided on a front portion of a top surface of the shielding layer, the solder rejecting layer having a smaller wettability for a solder than the shielding layer has for the solder.

10. The shielded module according to claim 9, wherein the solder rejecting layer extends to a portion of the side surface of the shielding layer.

* * * * *